United States Patent
Wang et al.

(10) Patent No.: US 6,913,070 B2
(45) Date of Patent: Jul. 5, 2005

(54) PLANAR HEAT PIPE STRUCTURE

(76) Inventors: Chin Wen Wang, 4F-3., No.9, Sinfu 1st St., Pingjhen City, Taoyuan County 324 (TW); Pei Choa Wang, 14F-3., No.9, Sinfu 1st St., Pingjhen City, Taoyuan County 324 (TW); Ching Chung Wang, 14F., No.9, Sinfu 1st St., Pingjhen City, Taoyuan County 324 (TW)

( * ) Notice: Subject to any disclaimer, the term of this patent is extended or adjusted under 35 U.S.C. 154(b) by 0 days.

(21) Appl. No.: 10/653,104

(22) Filed: Sep. 3, 2003

(65) Prior Publication Data
US 2005/0045308 A1 Mar. 3, 2005

(51) Int. Cl.[7] .................................................. H05K 7/20
(52) U.S. Cl. .............................. 165/80.3; 165/104.26; 165/104.33; 165/121
(58) Field of Search ............................... 165/80.3, 185, 165/121; 361/697, 704, 710

(56) References Cited

U.S. PATENT DOCUMENTS

| | | | | |
|---|---|---|---|---|
| 4,899,210 A | * | 2/1990 | Lorenzetti et al. ............ | 257/712 |
| 5,661,638 A | * | 8/1997 | Mira ............................ | 361/697 |
| 6,244,331 B1 | * | 6/2001 | Budelman ................... | 165/80.3 |
| 6,659,169 B1 | * | 12/2003 | Lopatinsky et al. ......... | 165/121 |
| 6,661,660 B2 | * | 12/2003 | Prasher et al. .............. | 361/700 |
| 6,749,013 B2 | * | 6/2004 | Ikeda et al. ............ | 165/104.26 |

* cited by examiner

Primary Examiner—Allen J. Flanigan

(57) ABSTRACT

An improved structure of a planar heat pipe, having a top lid and a bottom lid. The bottom lid can be engaged with the top lid. A wick structure and a working fluid are installed in the heat pipe. The top lid has a top panel, which has a central flat area and a plurality of independent heat dissipating fins spirally arranged around the flat area. Each of the heat dissipating fins has a cone shape, and the height of the heat dissipating fins gradually increases from the center to the periphery of the top lid. A spiral heat circulating path is thus formed on the top lid. Thereby, when the cooling fan generates cooling air flow downwardly, an air impingement is formed upon the flat region of the top lid. The heat accumulated in the central flat region is then dissipated by the heat dissipating fins with an enhanced efficiency.

9 Claims, 6 Drawing Sheets

PLANAR HEAT PIPE STRUCTURE

BACKGROUND OF THE INVENTION

The present invention relates generally to an improved structure of a planar heat pipe and, more particularly, to a planar heat pipe used in a computer central processing unit or other electronic heat generating device. The planar heat pipe has high thermal conductivity to dissipate effectively dissipate heat generated by the computer central processing unit or the electronic heat generating device, such that the heat generating device can operate under a uniform temperature.

The development of the computer information technology greatly advances of the designs in the computer related field. For the conventional computer, the operation speed is relatively slow, and the cooling device with a fin-type heat sink and a cooling fan is sufficient. Recently, the clock pulse of the central processing unit has exceeded 1 GHz or even 3 GHz. As the heat generated by the central processing unit is proportional to the clock pulse. The conventional cooling device, being restricted by the limited space within the enclosure of the central processing unit, cannot effectively dissipate the increasing heat generated by the higher operation speed.

FIG. 1 shows a conventional planar heat pipe cooling device. As shown in FIG. 1, the cooling device comprises a heat pipe 10a, a heat sink 20a and a cooling fan 30a. The heat pipe 10a includes a planar heat pipe, in which a wick structure 11a is formed and a working fluid is injected. The heat sink 20a, such as an aluminum pressed heat sink, is installed on the heat pipe 10a. The heat sink 20a includes a plurality of separate heat dissipating fins 21a, between which air circulating channels 22a are formed. By this structure, air blown from the cooling fan 30 is guided into the air circulating channels 22a of the heat sink 20a, such that heat generated by the electronic product such as central processing unit can be dissipated to the external environment.

The conventional planar heat pipe cooling device has the following drawbacks. Firstly, as the air flow blown by the cooling fan 30a has a spiral form. When such air is directed into the channels 22a of the heat sink 20a, turbulence is easily generated. Therefore, air flow cannot be directed to the root of the heat dissipating fins 21a, the heat dissipation efficiency cannot be properly enhanced.

Secondly, the above cooling device uses heat dissipating paste to coat and combine the planar heat pipe 10a and the heat sink 20a. The heat conductivity is affected by the heat dissipating paste.

Therefore, there exist inconvenience and drawbacks for practically application of the above conventional planar heat pipe structure. There is thus a substantial need to provide an improved structure of a planar heat pip heat pipe that resolves the above drawbacks and can be used more conveniently and practically.

BRIEF SUMMARY OF THE INVENTION

The present invention provides an improved structure of a planar heat pipe. By impinging air generated by a cooling fan onto a central flat region of a top lid, an air impingement is generated. The air impingement diffuses the heat and force the heat to flow through the channel formed by the heat dissipating fins on the top lid. Therefore, the heat can be effectively dissipated towards the external environment.

The planar heat pipe further comprises a fitting structure for assembling a fan seat and the cooling fan to optimize the cooling effect.

The planar heat pipe provided by the present invention comprises a top lid and a bottom lid. The top lid is engaged with the bottom lid to form an internal cavity. Inside the internal cavity, a wick structure is formed, and a working fluid is injected. The top lid includes a top panel, on which a central flat region is formed, and a plurality of independent heat dissipating fins is spirally arranged around the central flat region. The heat dissipating fins have heights gradually increase from the central flat region towards a periphery of the top panel, and the heat dissipating fins form a spiral flow channel for circulating heat.

BRIEF DESCRIPTION OF THE DRAWINGS

These, as well as other features of the present invention, will become more apparent upon reference to the drawings wherein.

DETAILED DESCRIPTION OF THE INVENTION

Figure 1:
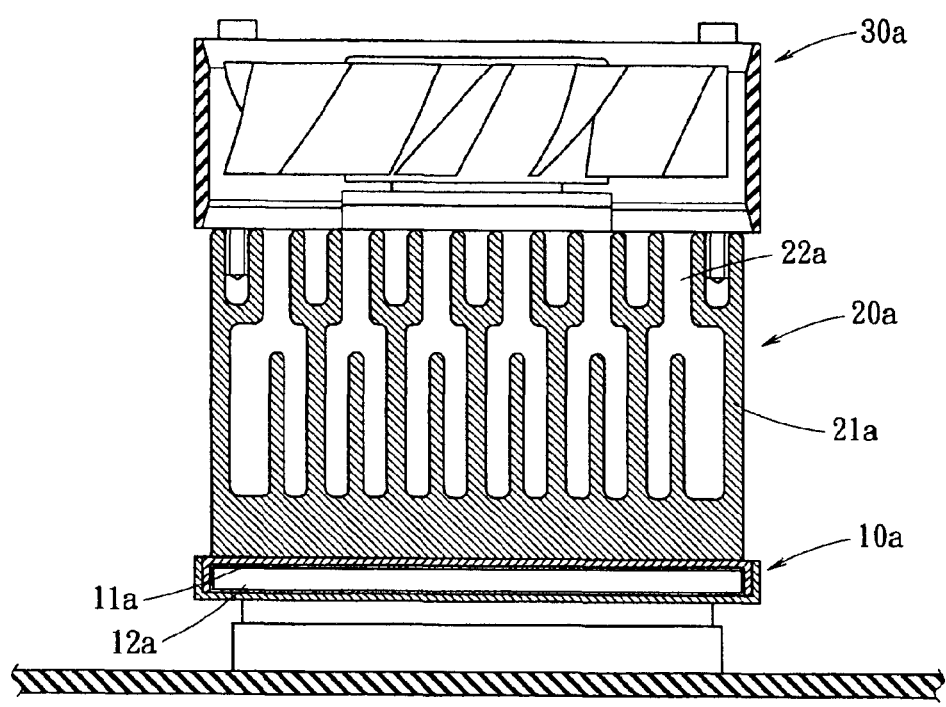
FIG. 1 shows a conventional cooling device.
Figure 2:
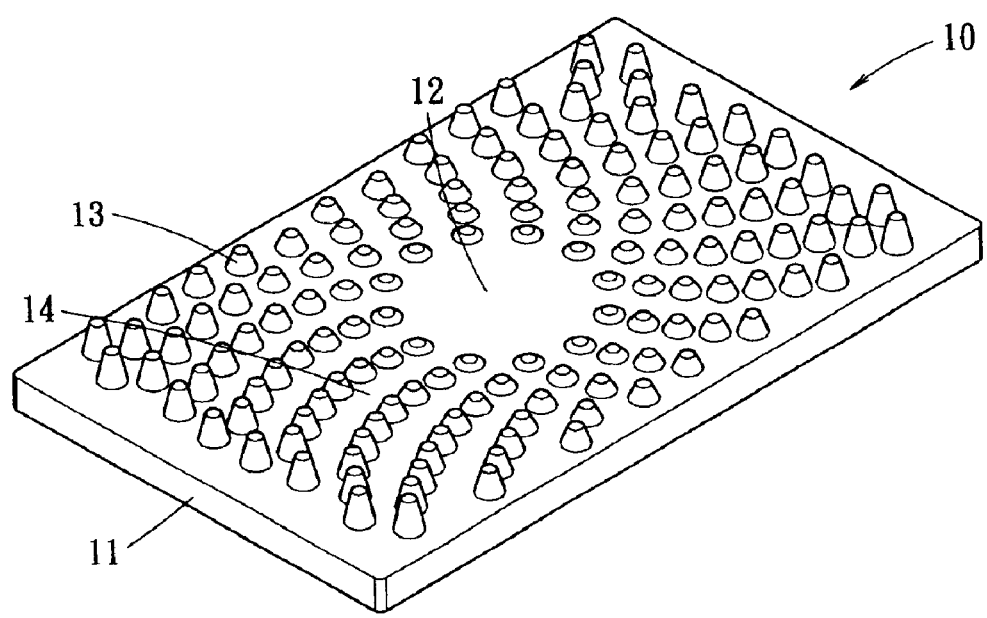
FIG. 2 shows a perspective view of a top lid.

Referring to FIG. 2, a perspective view of a top lid is illustrated. As shown, the top lid 10 is in a cuboid shape and includes a top panel 11 circumscribed by four side panels. The top lid 10 is made material with good thermal conductivity. The side panels around the top panel 11 may further include a plurality of fitting plates (not shown). The top panel 11 includes a circular flat region 12 at a center thereof and a plurality of independent heat dissipating fins 13 spirally arranged around the circular flat region 12. The heat dissipating fins 13 are preferably forged into conical shapes with large bottom surfaces and small top surfaces or tips. The heights of the heat dissipating fins 13 increase gradually from the central circular flat region 12 to a periphery of the top panel 11. A spiral channel 14 is thus formed allowing air to circulate through. The spiral channel 14 is particularly advantageous for guiding the spiral air flow generated by a cooling fan.

Figure 3:
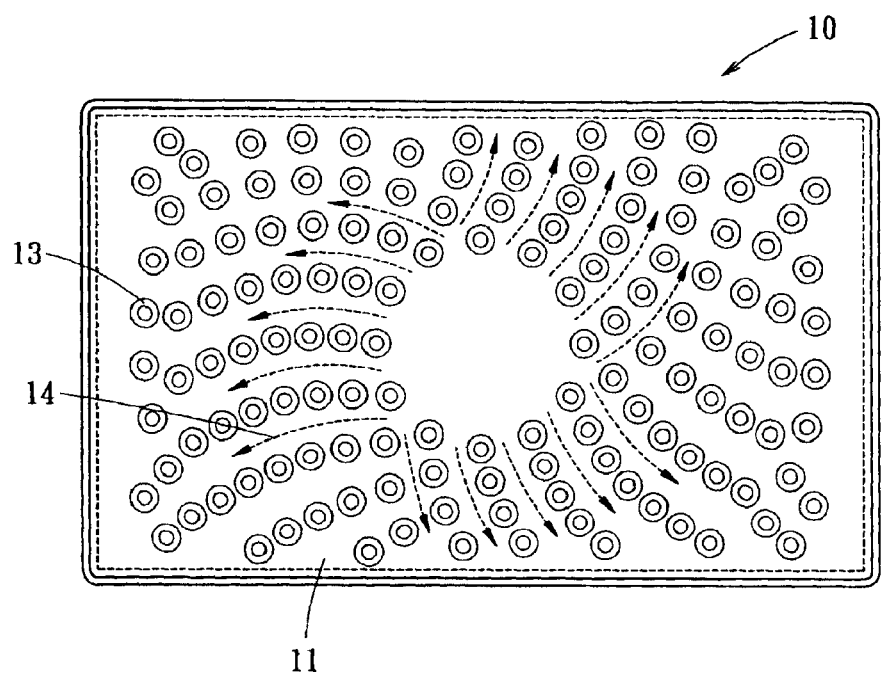
FIG. 3 shows a top view of the top lid as shown in FIG. 2.
Figure 4:
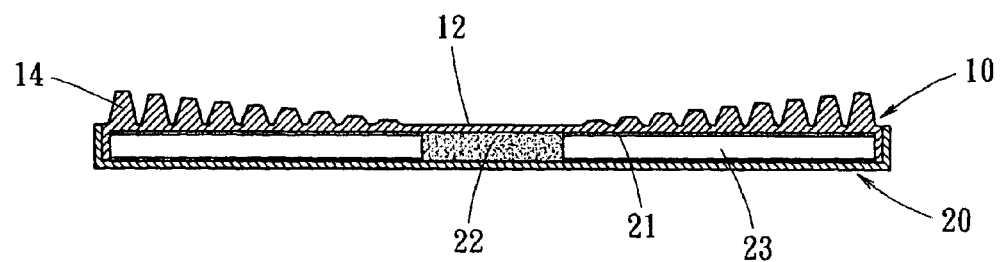
FIG. 4 shows a cross sectional view of the top lid.

FIGS. 3 and 4 show a top view and a cross sectional view of a planar heat pipe provided by the present invention. As shown, the planar heat pipe includes a top lid 10 and a bottom lid 20.

The top lid 10 includes four side panels circumscribing a top panel. The top lid 10 is engageable with the bottom lid 20. A wick structure is formed in an internal cavity formed by the top lid 10 and the bottom lid 20, and a working fluid is injected into the internal cavity. The wick structure includes a first structure 21 uniformly distributed on an internal wall of the internal cavity, and a second structure 22 localized underneath the flat region 12 of the top lid 10. While applying the heat pipe to a central processing unit, the second structure 22 is positioned thereon, such that heat generated by the central processing unit is quickly transferred to the top lid 10.

Figure 5:
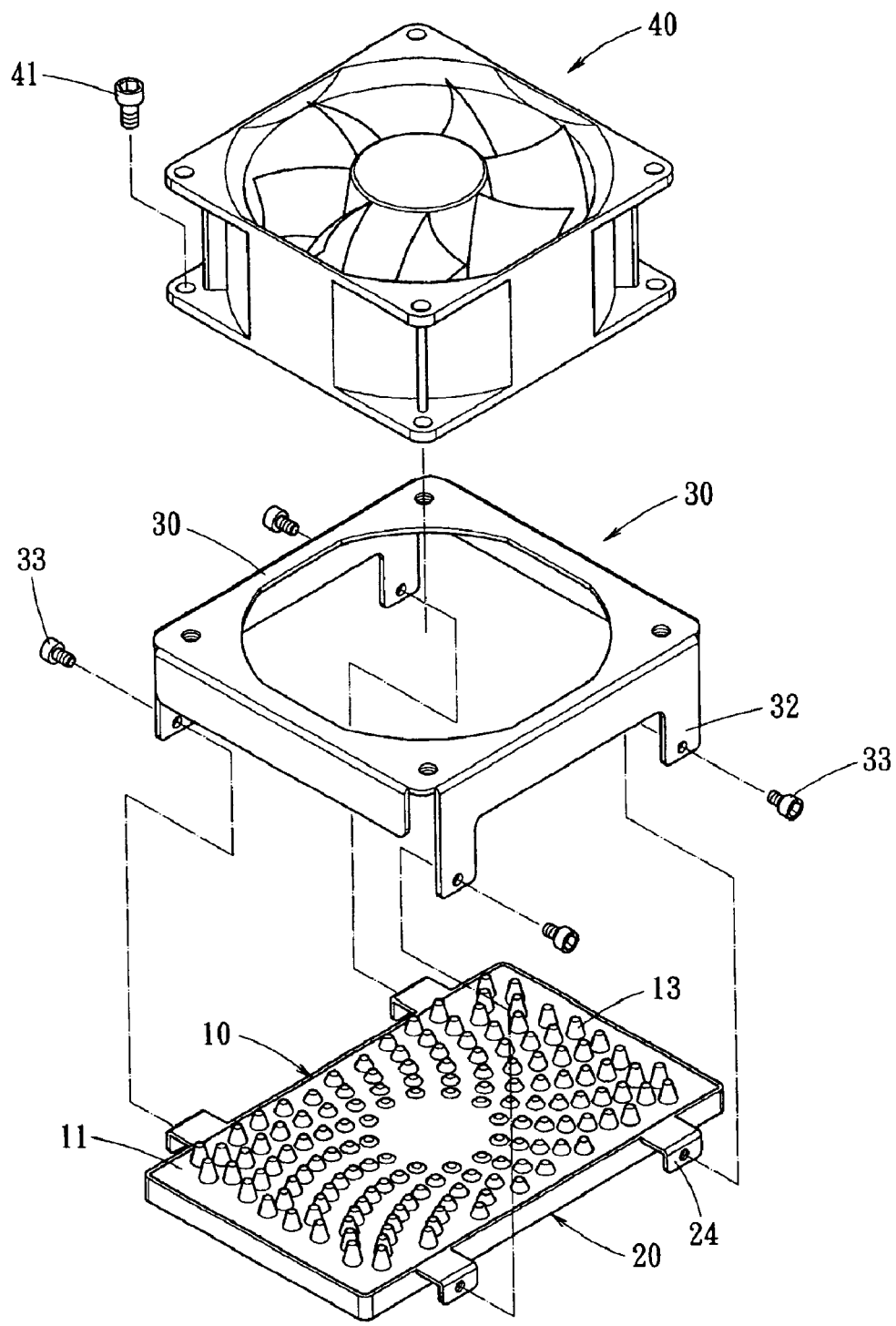
FIG. 5 shows an exploded view of a cooling fan.

As shown in FIG. 5, an exploded view of the cooling device is shown. The cooling device further comprises a fan seat 30 and a cooling fan 40. In this embodiment, the side plates of the bottom lid 20 further comprises a plurality of fitting plates 24. The fitting plates 24 are in L shape for fitting the fan seat 30. The fan seat 30 includes a hollow installation part 31 allowing air flowing upward and downward between the top lid 10 and the cooling fan 40. The cooling fan 40 is fixed on the installation part 31 of the fan seat 30 by fastening members such as the screws 41 shown in FIG. 5. The fan seat 30 may also comprises supporting legs 32 extending downward from four corners thereof. As shown, the supporting legs 32 are fastened with the fitting plates 24 of the bottom lid 20 by fastening members such as screws 33. Similarly, the supporting legs 32 of the fan seat 30 can also be fastened with the fitting plates of the top lid 10.

Figure 6:
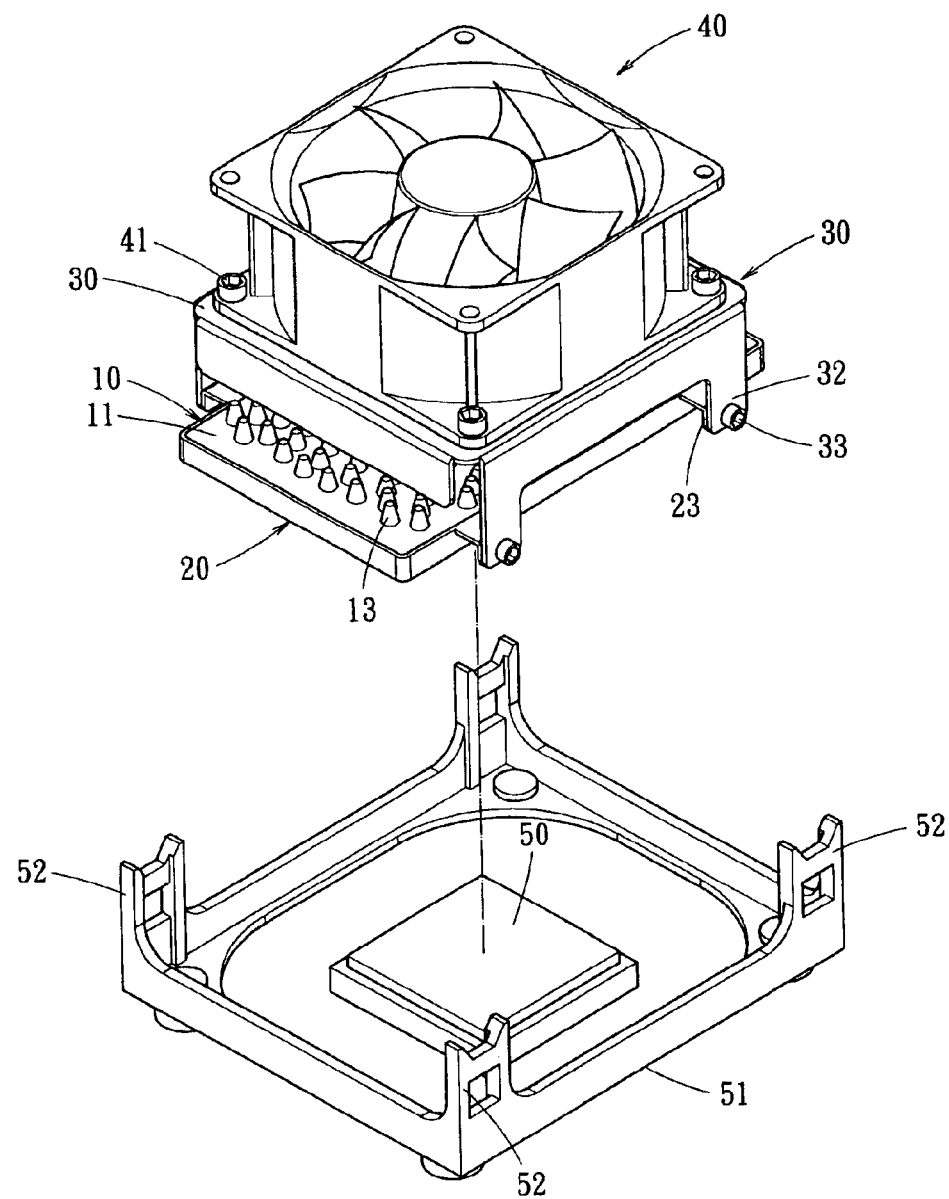
FIG. 6 shows a cooling device mounted over a central processing unit.

As shown in FIG. 6, the exterior feature of the cooling device installed on a central processing unit 50 is illustrated. The central processing unit 50 is located at the middle of a fitting frame 51. The fitting frame 51 has a hollow center and four latching members 52 extending from four corners thereof. During assembly, the cooling device is mounted on the fitting frame 51. Resilient clips (not shown) are formed at two short sides of the fitting frame 51, and resilient latching means are formed on the corresponding latching members 52, such that the resilient clips latches with the latching members 52. The centers of the resilient clips are then pressed against the cooling device, such that the cooling device is fixed over the central processing unit 50.

Figure 7:
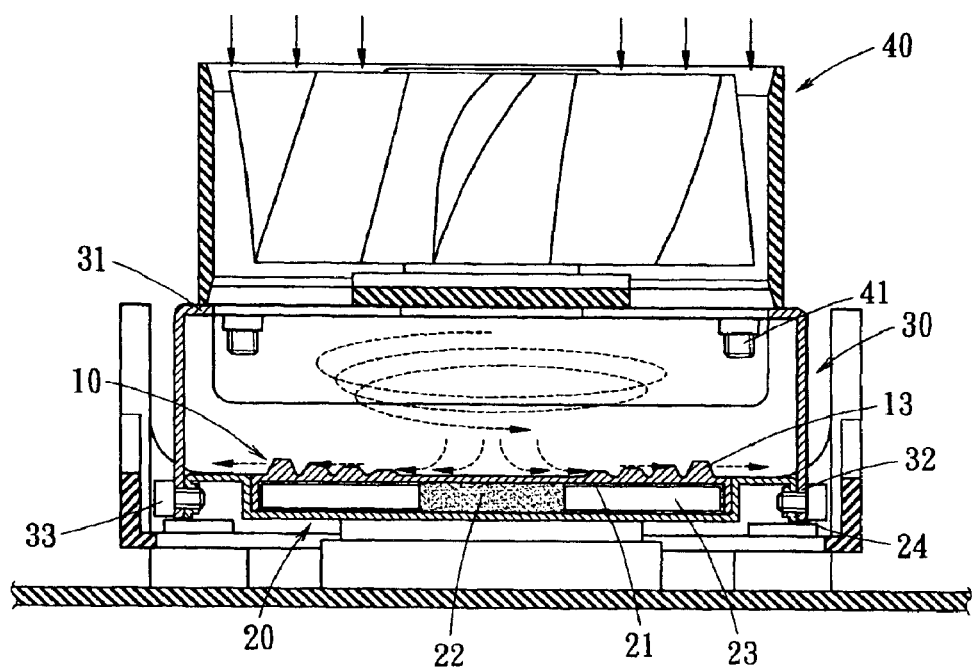
FIG. 7 shows the operation mode of the cooling device.

Referring to FIG. 7, the operation status of the present invention is illustrated. By the assembly of the above devices, the center of the bottom surface of the bottom lid 20 is adhered over the central processing unit 50. The second structure 22 formed in the internal cavity of the planar heat pipe is placed on top of the central processing unit 50. Therefore, the second structure 22 accumulates most of the heat generated by the central processing unit 52. When the cooling fan 40 starts operating, a cooling air is generated to impinge the flat region 12 of the top lid 10. The heat accumulated in the second structure 22 thus is forced to diffuse around and flows through the channel between heat dissipating fins 13 of the top lid 10, and the heat is effectively dissipated thereby.

Therefore, the improved structure of the planar heat pipe comprises the following advantages.

1. By the spiral flow channel, the cooling air generated by the cooling fan can be fluently guided to enhance the heat dissipation efficiency.

2. The second structure formed in the internal cavity of the planar heat pipe can effectively accumulate and dissipate heat generated by the heat source, such that system down due to instant temperature increase can be avoided.

3. By the cooling air impingement formed on the flat region of the top lid, the heat can be effectively dissipated.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A cooling device comprising:
  a planar heat pipe comprising a top lid and a bottom lid engageable with the top lid to form an internal cavity, the planar heat pipe further comprising a wick structure and a working fluid in the internal cavity, wherein the top lid includes a top panel, which comprises a central flat region and a plurality of independent heat dissipating fins spirally arranged around the central flat region to from a spiral channel;
  a fan seat, fitting over the planar heat pipe; and
  a cooling fan, mounted on the fan seat,
  wherein the top panel of the top lid further comprises a plurality of fitting plates, and the fan seat comprises a plurality of supporting legs to be latched with the fitting plates of the top panel of the top lid.

2. The cooling device of claim 1, wherein the bottom lid comprises a plurality of fitting plates for fitting the fan seat.

3. The cooling device of claim 1, wherein the fan seat comprises a plurality of supporting leg to be fastened with the fitting plates of the bottom lid.

4. A planar heat pipe, comprising a top lid and a bottom lid engageable with the top lid to form an internal cavity, the planar heat pipe further comprising a wick structure and a working fluid in the internal cavity, wherein the top lid includes a top panel, which comprises a central flat region and a plurality of independent heat dissipating fins spirally arranged around the central flat region to form a spiral channel, and wherein the heights of the heat dissipating fins increase from the central flat region towards a periphery of the top panel.

5. The planar heat pipe of claim 4, wherein the top panel of the top lid is circumscribed by four side panels.

6. The planar heat pipe of claim 4, wherein the central flat region has a circular shape.

7. The planar heat pipe of claim 4, wherein each of the heat dissipating fins has a conical shape.

8. The planar heat pipe of claim 4, wherein the bottom panel is circumscribed by four side panels.

9. The planar heat pipe of claim 4, wherein the wick structure comprises a first structure uniformly distributed on an internal wall of the internal cavity, and a second structure concentrated under the central flat region of the top lid.

* * * * *